United States Patent
Farrenkopf

Patent Number: 5,854,099
Date of Patent: Dec. 29, 1998

[54] DMOS PROCESS MODULE APPLICABLE TO AN $E^2$ CMOS CORE PROCESS

[75] Inventor: Douglas R. Farrenkopf, Santa Clara, Calif.

[73] Assignee: National Semiconductor Corporation, Santa Clara, Calif.

[21] Appl. No.: 870,920

[22] Filed: Jun. 6, 1997

[51] Int. Cl.$^6$ .................................. H01L 21/8247
[52] U.S. Cl. ................. 438/201; 438/262; 438/268
[58] Field of Search ..................... 438/201, 258, 438/262, 263, 268, 279, 282, 545, 546

[56] References Cited

U.S. PATENT DOCUMENTS

| | | | |
|---|---|---|---|
| 4,317,273 | 3/1982 | Guterman et al. | 438/262 |
| 5,171,699 | 12/1992 | Hutter et al. | 438/268 |
| 5,348,895 | 9/1994 | Smayling et al. | 438/268 |
| 5,589,405 | 12/1996 | Contiero et al. | 438/268 |

Primary Examiner—Chandra Chaudhari
Attorney, Agent, or Firm—Limbach & Limbach L.L.P.

[57] ABSTRACT

In a method of fabricating a DMOS transistor structure, wherein the DMOS transistor structure includes an active semiconductor substrate region having a tub of N-type conductivity formed therein, the N-type tub being formed over an N$^+$ buried region, and having an N$^+$ sinker region formed therein at an edge of the N-type tub, the N$^+$ sinker region extending from a surface of the N-type tub to the N$^+$ buried region, a pad oxide layer is formed on the N-tub and on the N$^+$ sinker region. A composite mask is then formed on the silicon nitride layer, and includes etched openings such that the surface of the periphery of the N-type tub is exposed and the interface between the N-type tub and the N$^+$ sinker region is exposed. The composite mask is then utilized to form field oxide isolation regions in the semiconductor substrate region at the periphery of the N-type tub and at the interface between the N-type tub and the N$^+$ sinker region. After removing the composite mask, a P-body mask is formed on the nitride layer. Finally, a metal layer is formed over the structure resulting from the above-defined steps to form metal contacts to the P-body region, the gate contact and the N$^+$ sinker region.

3 Claims, 7 Drawing Sheets

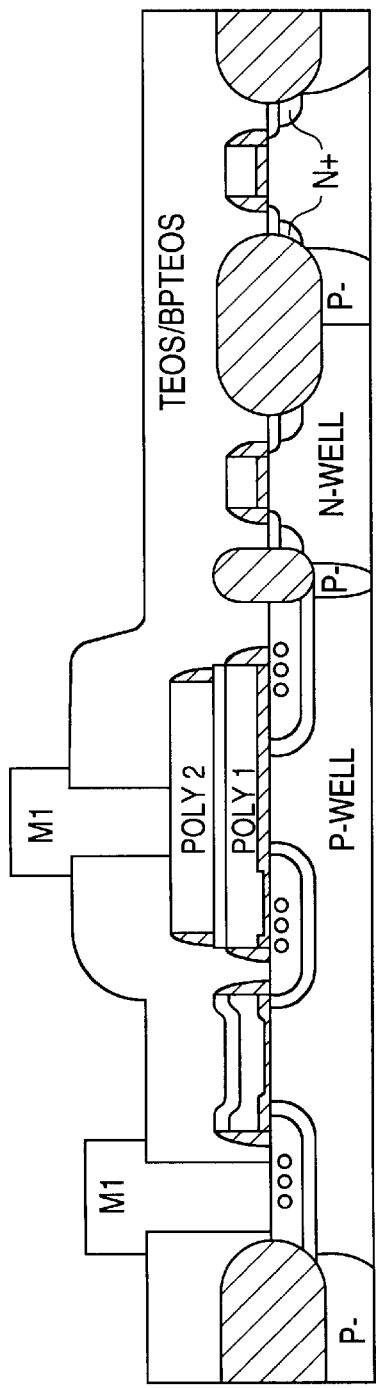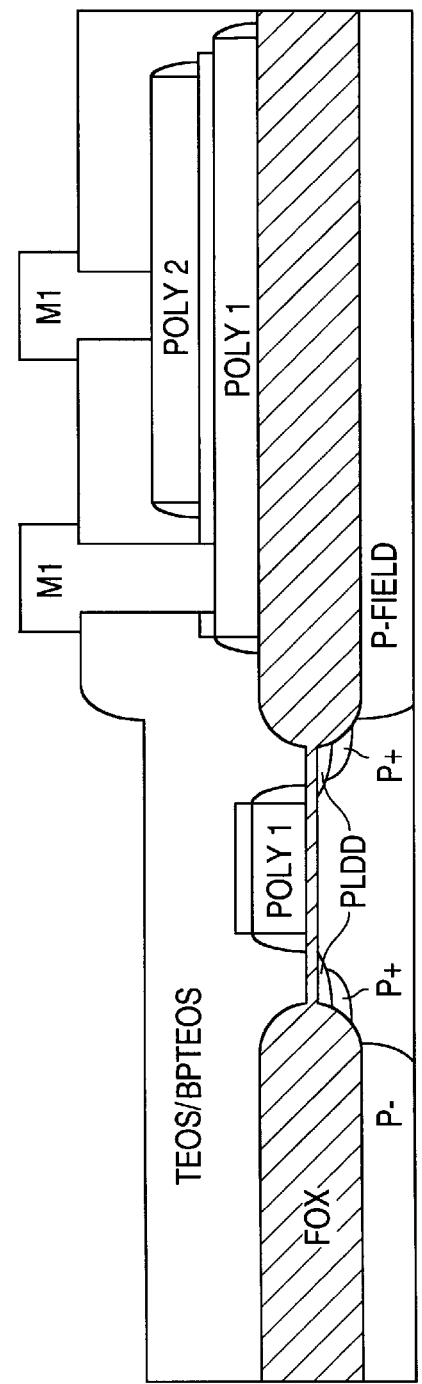
FIG. 2A
(PRIOR ART)
FIG. 2B
(PRIOR ART)

DMOS PROCESS MODULE APPLICABLE TO AN E² CMOS CORE PROCESS

BACKGROUND OF THE INVENTION

1. Field of the Invention

The present invention relates to the fabrication of integrated circuit devices and, in particular, to a DMOS process module that allows DMOS transistors to be incorporated into a CMOS-based EEPROM fabrication process without disturbing the existing CMOS/E² devices, and while also producing DMOS devices with highly controllable parameters.

2. Discussion of the Related Art

DMOS transistors require the N-source region to be self-aligned to the P-body implant in order to have good threshold voltage and $R_{ds}$ (on) control. This is typically accomplished by implanting the P-body after the DMOS polysilicon is defined, driving it in with a large $\sqrt{Dt}$ heat cycle and then implanting the N-source. The DMOS channel length is defined as the lateral length of the P-body region under the polysilicon gate.

A process flow for fabricating a conventional DMOS structure is illustrated in greater detail in FIGS. 1A–1C.

FIG. 1A shows an N⁺ buried layer 102 formed on a silicon substrate 100 of P⁻ conductivity. N-tub region 106 and N-sinker region 108 are then determined using N-tub and N-sinker masks, respectively. Field oxide isolation regions 104 are then defined, with an additional field oxide region 104' providing isolation for the N⁺ sinker region 108. A layer of gate oxide 110 separates the polysilicon gate regions 112 from the N-tub 106. A photoresist mask 114 is used to facilitate a boron implant for initial introduction of P-type dopant for the P-body region. FIG. 1B shows the P-body region 116 of the PMOS device following thermal drive-in. FIG. 1C shows the final DMOS device structure after a mask and ion implant step to define N-source regions 118. The channel length of the DMOS device shown in FIG. 1C is designated as $L_D$. It is noted that, in this design, the channel length $L_D$ is not effected by mask misalignments and etch biases.

Cross-sections of a conventional E²PROM device structure are shown in FIGS. 2A and 2B. In the process utilized to manufacture the illustrated E² structure, the $\sqrt{Dt}$ cannot be too high after the floating polysilicon deposition or the double diffused drain (DDD) and high voltage threshold voltage (HV$_t$) implants, which are implanted before floating poly deposition, will be disturbed and the tunnel oxide will be degraded. That is, if a high $\sqrt{Dt}$ heat cycle is run after the floating poly step, then the DDD implant will diffuse too deeply beyond the typically desired 0.4 $\mu$m depth; the HV$_t$ implant would also diffuse deeper, changing the threshold voltage of the device.

There are upcoming circuit applications which require that both E²PROMs and DMOS structures be fabricated on the same chip. It is desirable to use the same polysilicon layer for both the E²PROM floating gate and for the DMOS poly gate. If separate gate oxides and polys are used for each device, the number of processing steps increases, thereby increasing wafer cost and defect density. Also, if separate polys are used, a "poly stringer" problem can be introduced. This is a result of the second poly deposition occurring over the sharp steps of the masked and defined first poly. This type of structure is difficult to etch without leaving second poly filaments.

The problem of using the E²PROM floating poly as the DMOS gate poly is now apparent. The E²PROM structure requires that the $\sqrt{Dt}$ heat cycles be relatively low after the floating poly is deposited, while the DMOS structure requires that the heat cycles be relatively high, at least high enough to drive the P-body approximately one micron laterally.

SUMMARY OF THE INVENTION

The present invention provides a process module in which the P-body implant and the N-source implants for a DMOS device are self-aligned to composite nitride, which is later stripped off. The important result is that the channel length $L_D$ of the DMOS device is self-aligned and not dependent upon masking alignments or etch biases. While the same cannot be said for the length of the gate overlap of the source $L_S$, precise control of this overlap length is not critical in a DMOS transistor.

There are two important reasons why the channel length $L_D$ must be well controlled. First, in a DMOS transistor, the threshold voltage is determined by the P-body concentration in the proximity of the N⁻ source. If there is misalignment, even on the order of 0.1 $\mu$m, between the source and the P-body, this will result in large threshold voltage variations. Second, $R_{ds}$ (on) is effected by channel length $L_D$; therefore, variations in channel length $L_D$ result in variations in $R_{ds}$ (on). The gate/source overlap $L_S$, on the other hand, would only affect the DMOS transistor negatively if it became so long as to significantly increase the source resistance. In a process in accordance with the present invention, the gate/source overlap only increases the source resistance to the extent that the total $R_{ds}$ (on) is increased by less than one percent, which is insignificant.

A better understanding of the features and advantages of the present invention will be obtained by reference to the following detailed description and accompanying drawings which set forth an illustrative embodiment in which the principles of the invention are utilized.

DESCRIPTION OF THE DRAWINGS

FIGS. 2A and 2B are partial cross-sectional drawings illustrating a conventional E²PROM structure.

DETAILED DESCRIPTION OF THE INVENTION

A process flow for fabricating a DMOS transistor structure in an E² process flow, in accordance with the concepts of the present invention, will now be described in conjunction with the partial cross-sectional drawings provided in FIGS. 3A–3N. While specific process parameters are not provided, those skilled in the art will appreciate that the concepts of the invention are applicable regardless of these parameters, which will differ depending upon the specific device structure under manufacture.

Figure 1A:
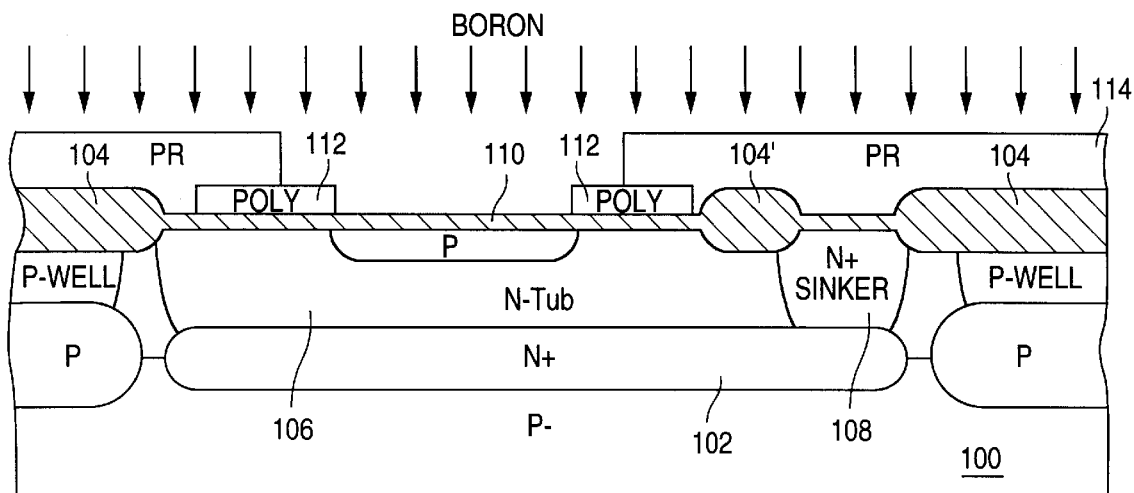
FIGS. 1A–1C are partial cross-sectional drawings illustrating conventional DMOS processing.
Figure 1B:
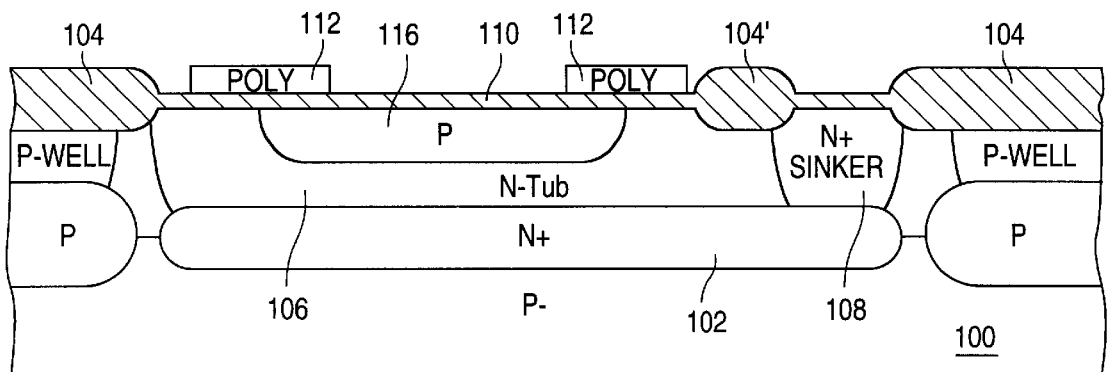
Figure 1C:
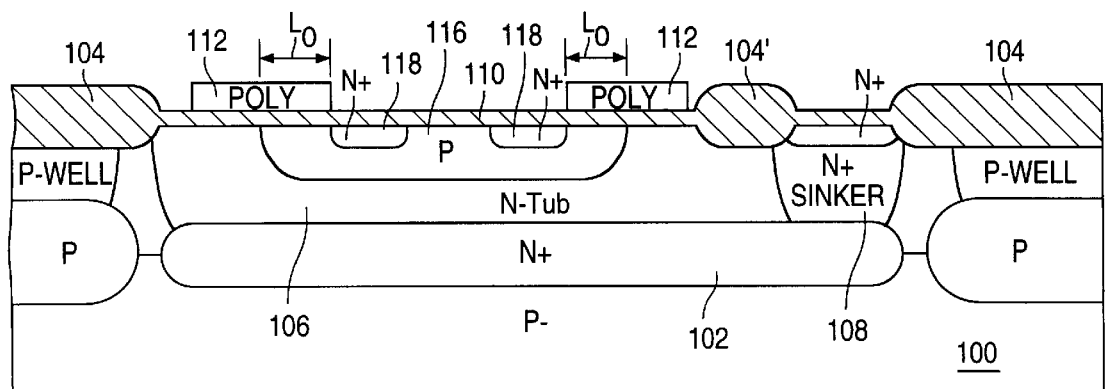
Figure 3A:
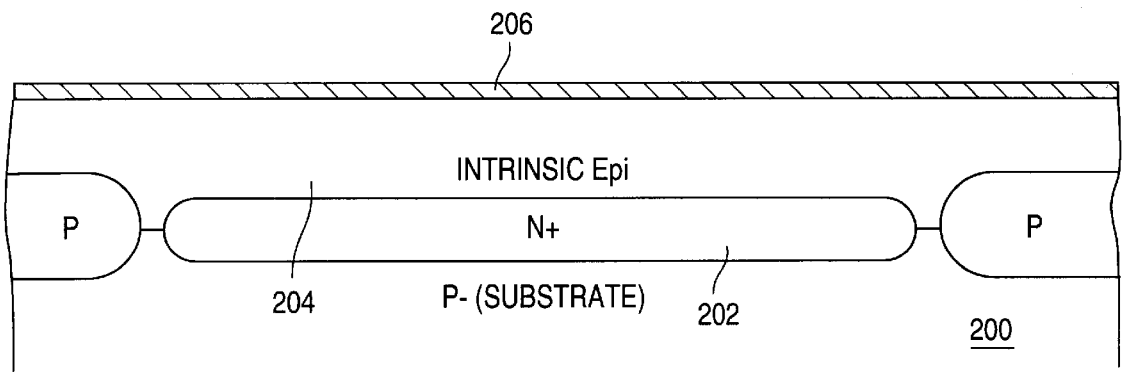
FIGS. 3A–3N are partial cross-sectional drawings illustrating a process flow for fabricating a DMOS structure in accordance with the present invention.

Referring to FIG. 3A, following conventional processing steps for zero mask, trench etch and laser scribe, buried layer pad oxide (not shown) is formed on a P-type substrate 200. An N+ mask (not shown) is then patterned and N-type dopant is implanted into the P-type substrate to define an N+ buried layer 202. This is followed by a P-iso mask and implant, buried layer drive-in, and pad oxide strip. Next, an epitaxial layer 204 is deposited and a sinker pad oxide layer 206 is formed on the intrinsic epitaxial layer 204. (It should be noted that back seals are required if the starting material is P−/P+).

Figure 3B:
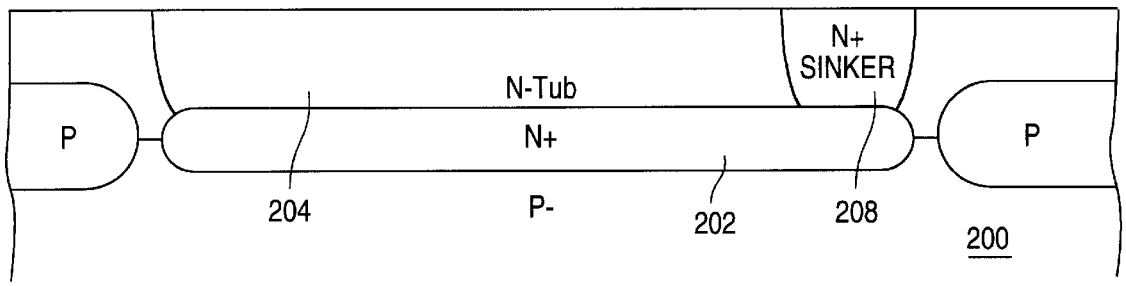

Next, a sinker mask (not shown) is formed over the above-described structure and an N+ implant is performed to define an N+ sinker region 208. This is followed by patterning of an N-tub mask and associated implant. A drive-in step is then performed to distribute dopant in the N-tub 204. This is followed by an oxide etch, resulting in the structure showing in FIG. 3B.

Figure 3C:
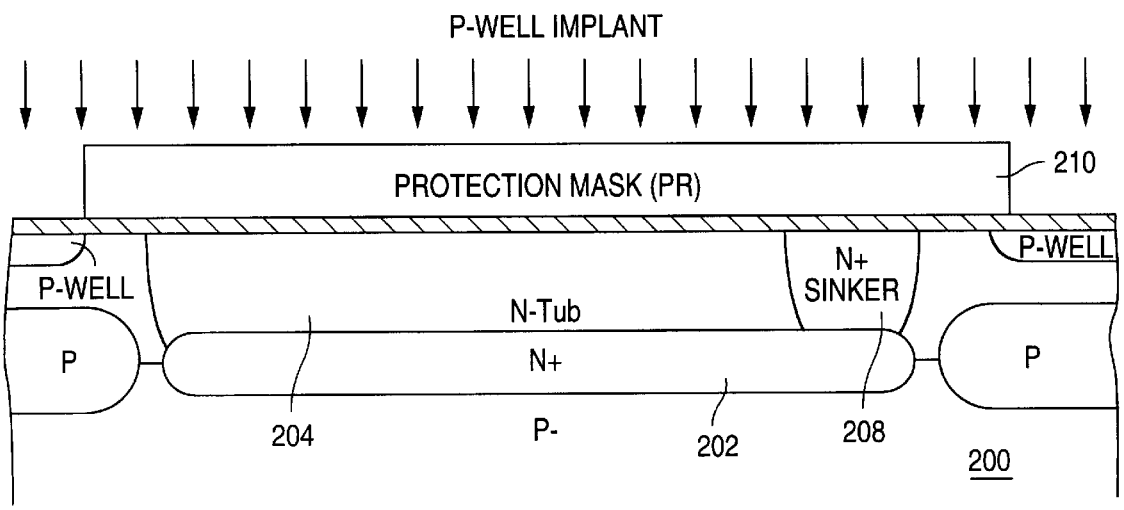

A layer of twin-well pad oxide is then formed and a layer of nitride deposited on the twin-well pad oxide. A twin-well photoresist mask is then patterned on the nitride and an N-well implant is performed; it is noted that the DMOS area is covered with resist during this process. The photoresist is then stripped, and a selective oxidation and nitride strip is performed. A photoresist protection mask 210 is then formed as shown in FIG. 3C and a P-well implant is performed.

Figure 3D:
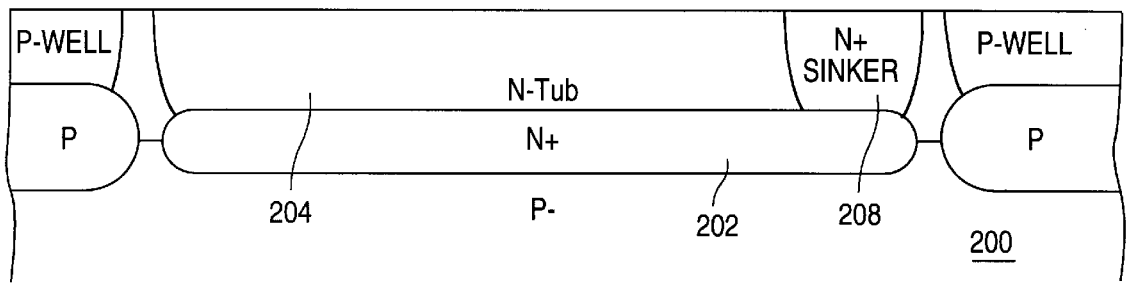

Next, selective oxide etch, twin-well drive-in, and twin-well drive-in oxide strip steps are performed, resulting in the structure shown in FIG. 3D.

Figure 3E:
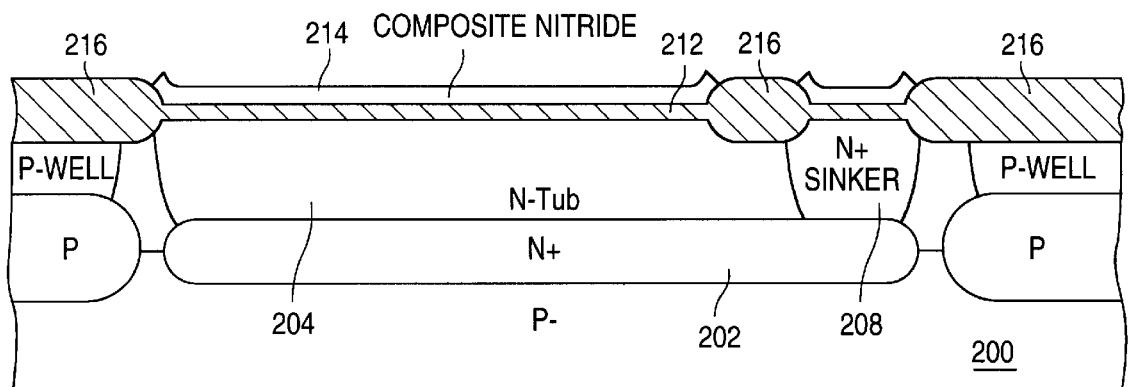

Referring to FIG. 3E, a composite pad oxide 212 and nitride 214 deposition is performed, followed by formation of a composite mask and etching of the composite nitride layer to identify field oxide regions. A P-field mask and implant and is then performed to increase the P-well field threshold voltage. Field oxide isolation regions 216 are then grown in the conventional manner, resulting in the structure showing in FIG. 3E.

Figure 3F:
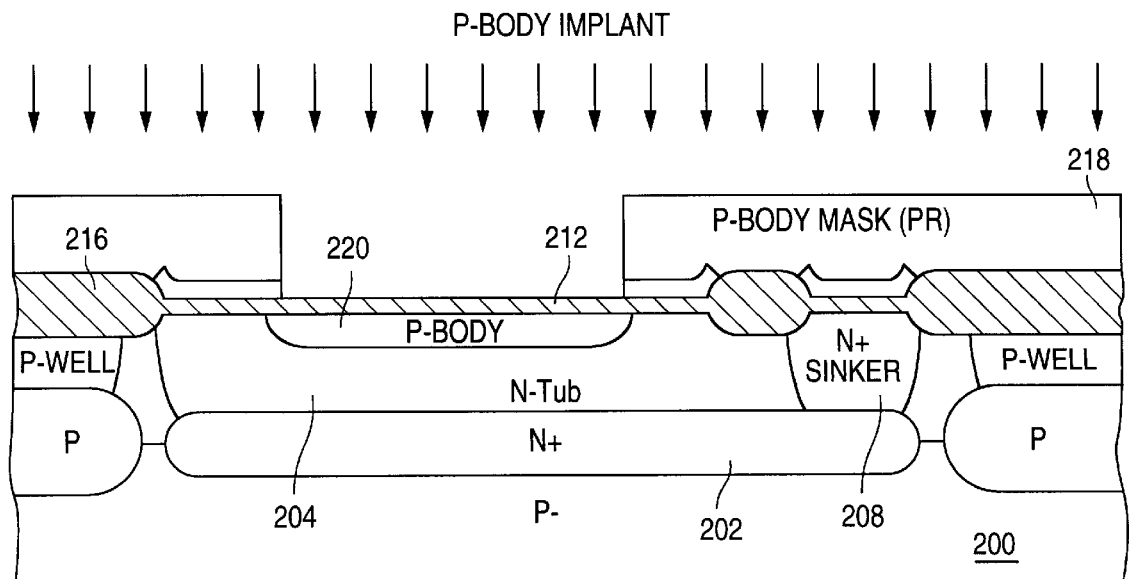

Next, as shown in FIG. 3F, a layer of resist is formed and the nitride 214 is etched using the P-body mask 218, enabling a subsequent implant of P-type dopant to form a P-body region 220 in the N-tub 204.

Figure 3G:
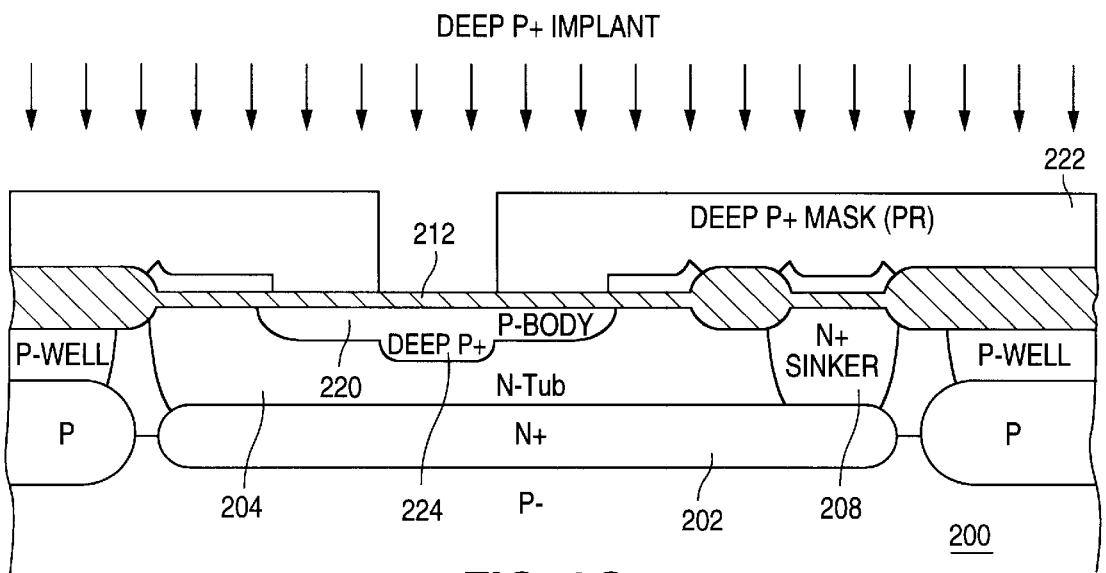

Following removal of the P-body mask 218, another layer of resist 222 is formed and patterned to enable another P-type implant to form a deep P+ region 224 within the P-body 220, resulting in the structure shown in FIG. 3G.

Figure 3H:
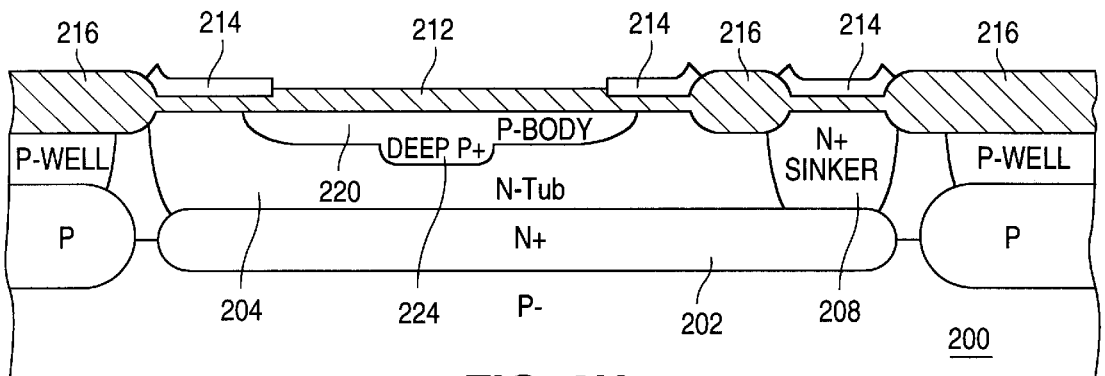

Turning now to FIG. 3H, the deep P+ resist mask 222 is then stripped and a P-body drive-in step is performed, resulting in the additional growth of oxide so that approximately 400 Å of oxide 212 remains over the P-body region 220 so that silicon is not reached at the subsequent composite nitride 214 strip step. The resulting structure is shown in FIG. 3H.

Figure 3I:
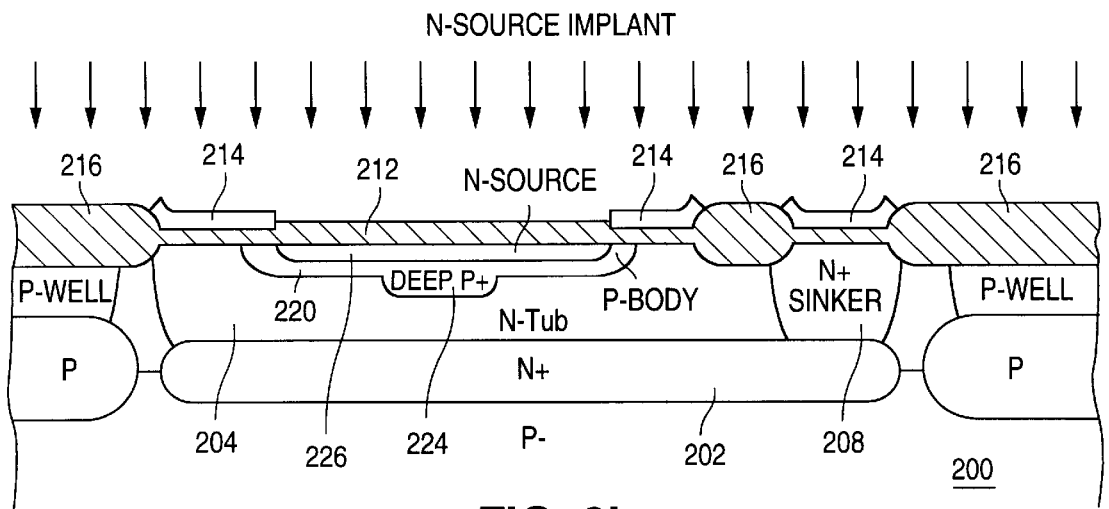

Referring to FIG. 3I, an ion implant of N-type dopant is then performed, resulting in the formation of an N-source region 226 in the P-body region 220, as shown in FIG. 3I. The nitride layer 214 should be thick enough to block the N-source implant at the periphery of the P-body region 220, but if it isn't, an additional nitride deposition step could be inserted before the P-body mask step described above.

Figure 3J:
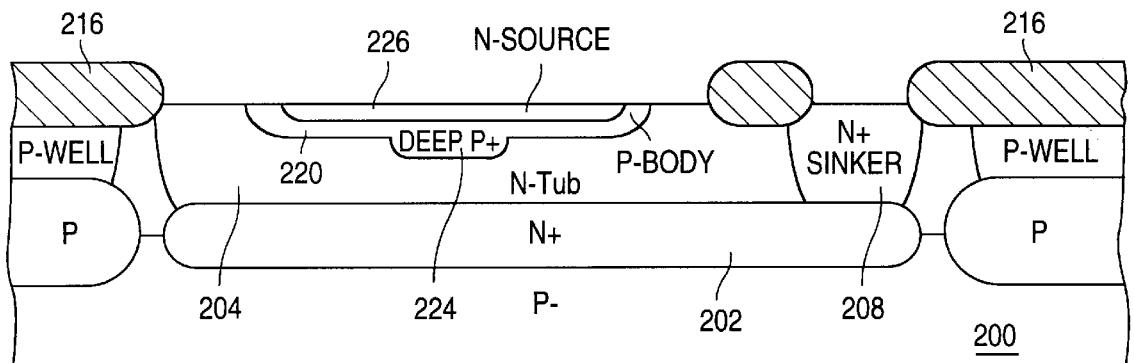

Next, following a nitride strip and pad oxide strip, a layer of sacrificial oxide is grown. Then, a threshold voltage $V_T$ adjust mask is defined to cover the DMOS region with resist. A $V_T$ implant is then performed to set the threshold voltages of the MOS devices to an appropriate level. The sacrificial oxide is then stripped resulting in the structure shown in FIG. 3J.

Figure 3K:
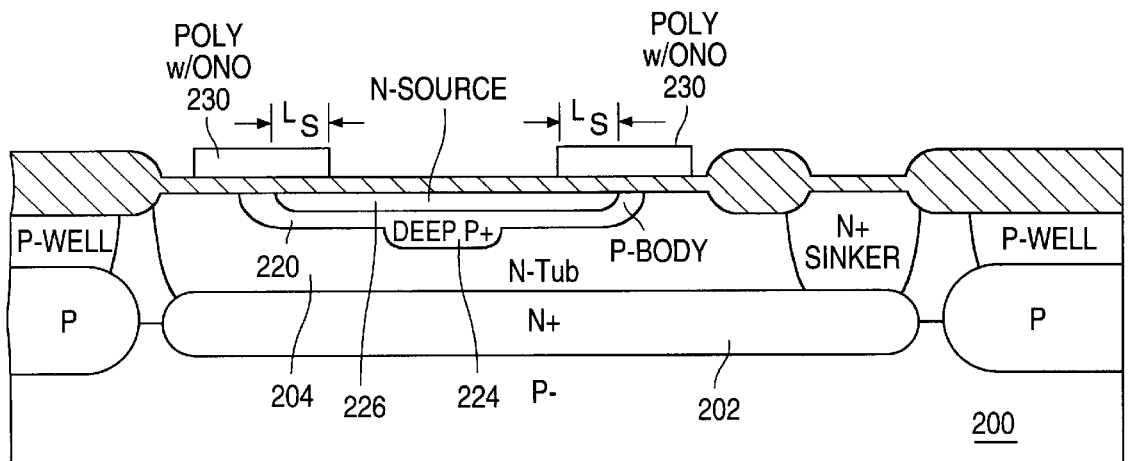

A screen oxide layer is then grown, and a buried N+ mask is formed, followed by a buried N+ implant. The screen oxide is then stripped and a cell gate oxide layer is formed. Next, a tunnel oxide mask is patterned, tunnel oxide windows are etched in the gate oxide and tunnel oxide is grown in the windows. A layer of polysilicon is then deposited and doped to a desired conductivity level. A layer of oxide/nitride/oxide (ONO) is then formed on the polysilicon layer. The polysilicon layer is then masked and etched to define the polysilicon floating gates of the $E^2PROM$ devices and, simultaneously, the polysilicon gate regions 230 of the DMOS transistors. The resulting DMOS structure is shown in FIG. 3K.

Figure 3L:
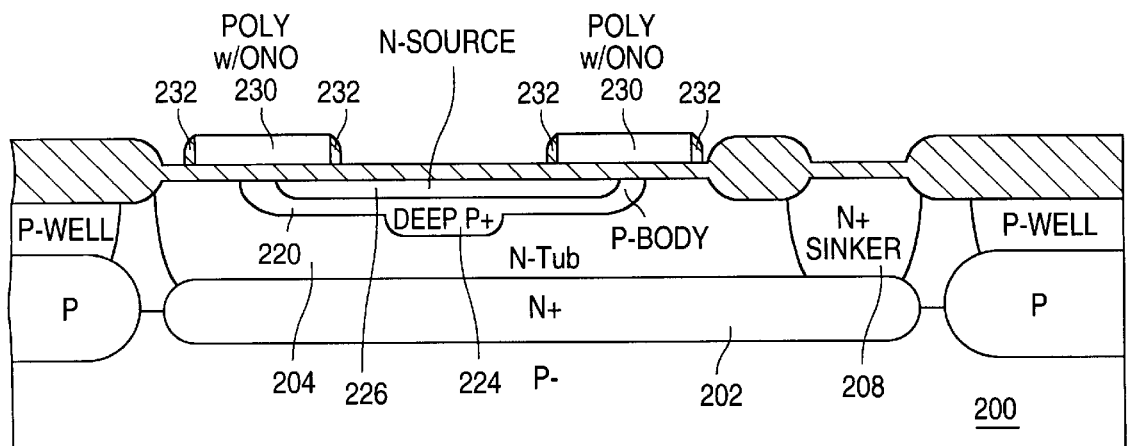

Referring to FIG. 3L, a threshold voltage implant for the low voltage devices is then performed, EPROM control gates are masked and implanted and a second gate oxide layer is grown. Next, the second layer of polysilicon is deposited, doped, masked and etched and a polyseal oxide is formed. Next, the PLDD mask and implant and NLDD mask and implant steps are performed, followed by the EPROM N+ mask and implant. Then, a spacer oxide is deposited and etched back to form oxide sidewall spacers 232 on the DMOS gate regions, as shown in FIG. 3L.

Figure 3M:
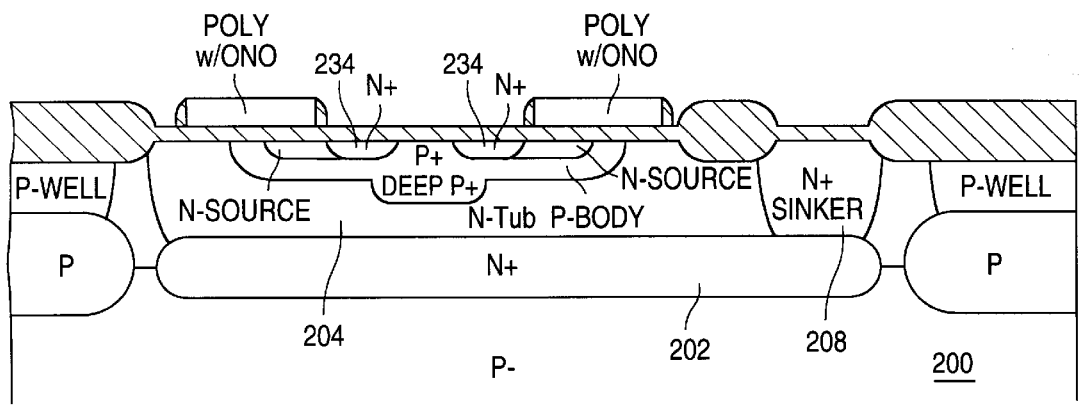

An N+ mask is then formed and N-type dopant is implanted into the DMOS structures to form the N+ junctions for the source/drain regions 234 of the device. Following a poly oxide step, a P+ mask and implant are performed to define the source/drain regions and the P+ channel region of the DMOS device, as shown in FIG. 3M.

Figure 3N:
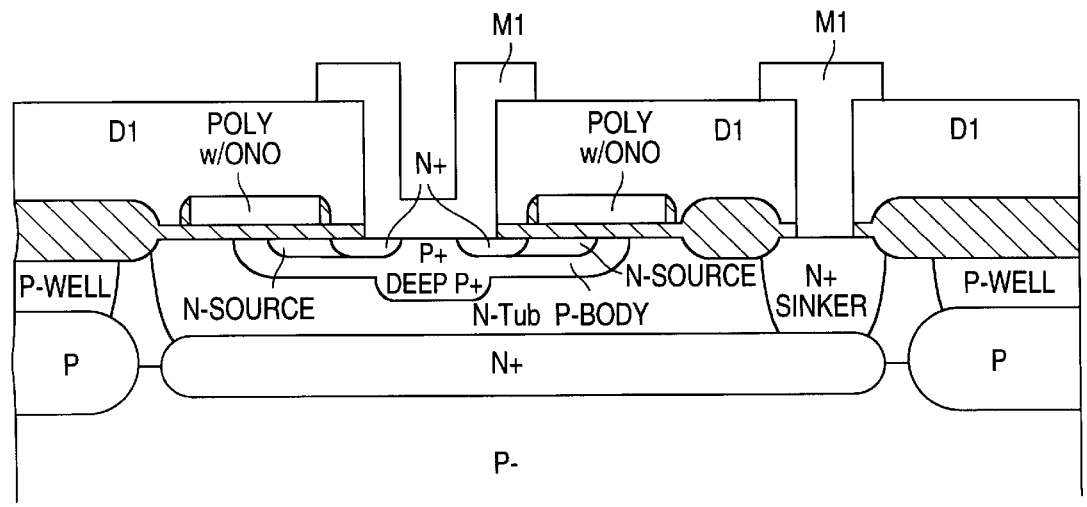

Finally, as shown in FIG. 3N, a layer of dielectric material Dl is formed, masked and etched to form contact openings to the DMOS P-body region and the N+ sinker region 200. This is followed by deposition, masking and etching of a first metal layer M1 to form the contacts to the P-body and N+ sinker regions. Contacts and metal M1 are also connected to the DMOS gate (not shown).

It should be understood that various alternatives to the embodiments of the invention described herein may be employed in practicing the invention. Thus, it is intended that the following claims define the scope of the invention and that structures within the scope of these claims and their equivalents be covered thereby.

What is claimed is:

1. A method of fabricating a DMOS transistor structure, the DMOS transistor structure including an active semiconductor substrate region having a tub of N-type conductivity formed therein, the N-type tub being formed over an $N^+$ buried region, the N-type tub having an $N^+$ sinker region formed therein at an edge of the N-type tub, the $N^+$ sinker region extending from a surface of the N-type tub to the $N^+$ buried region, the method comprising:

forming a pad oxide layer on the N-tub and on the $N^+$ sinker region;

forming a composite mask on the silicon nitride layer, the composite mask including etched openings such that the surface of the periphery of the N-type tub is exposed and the interface between the N-type tub and the $N^+$ sinker region is exposed;

utilizing the composite mask to form field oxide isolation regions in the semiconductor substrate region at the periphery of the N-type tub and at the interface between the N-type tub and the $N^+$ sinker region;

removing the composite mask;

forming a P-body mask on the nitride layer, the P-body mask including an etched opening formed therein to expose a surface area of the nitride layer overlying the N-type tub;

etching the nitride layer to remove nitride underlying the exposed nitride surface area to expose underlying pad oxide;

implanting dopant of P-type conductivity into the N-type tub in the area beneath the exposed portion of the pad oxide to form a P-body region in the N-type tub;

removing the P-body mask;

forming a deep P+ mask over the active semiconductor substrate region, the deep P+ mask having an opening formed therein over a central portion of the P-body region;

implanting dopant of P-type conductivity into the P-body region to form a deep P+ region within the P-body region;

removing the deep P+ mask;

performing a P-body thermal drive-in step that results in the growth of oxide over the P-body region such that the P-body region is not reached during a subsequent composite nitride strip step;

utilizing the composite nitride to perform a self-aligned ion implant of dopant of N-type conductivity to form an N-source region in the P-body region, the composite nitride layer being thick enough to block the N-source implant at the periphery of the P-body region;

stripping the composite nitride and pad oxide;

forming a layer of gate oxide over the N-type tub, including over the P-body region and the N-source region;

forming a layer of polysilicon over the gate oxide layer, etching the polysilicon layer to define polysilicon gate regions on the gate oxide layer, the polysilicon gate regions overlapping the interface between the N-source region and the P-body region and also overlapping the interface between the P-body region and the N-type tub;

forming oxide sidewall spacers on the sidewalls of the polysilicon gate regions;

utilizing the oxide spacers to perform a self-aligned implant of N-type dopant into the N-source region;

forming a P+ mask over the structure resulting from the above-defined steps, the P+ mask including an opening formed over the N+ implant region in the N-source region;

performing an implant of P-type dopant in a central portion of the N+ region to thereby create a region of P-type conductivity at a surface of the P-body region, thereby defining first and second spaced-apart N-type source/drain regions of the DMOS transistor structure;

forming a layer of dielectric material over the structure resulting from the above-defined steps;

forming contact openings in the dielectric layer to expose the P-body region and the N+ sinker region; and forming a metal layer over the structure resulting from the above-defined steps to form metal contacts to the P-body region and the N+ sinker region.

2. A method as in claim 1, and further comprising, following the step of removing the composite mask, forming a layer of additional nitride on the nitride layer.

3. A method as in claim 1, and where the step of performing a P-body thermal drive-in results in the growth of oxide such that about 400 Å of oxide remains over the P-body region.

* * * * *